(12) United States Patent
Harada et al.

(10) Patent No.: US 6,512,680 B2
(45) Date of Patent: *Jan. 28, 2003

(54) SEMICONDUCTOR PACKAGE

(75) Inventors: Yoshihito Harada, Yokohama; Katsunori Nakamura, Kawasaki, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/153,456

(22) Filed: Sep. 15, 1998

(65) Prior Publication Data

US 2002/0012234 A1 Jan. 31, 2002

(30) Foreign Application Priority Data

Sep. 19, 1997 (JP) ............................................... 9-255459
Dec. 11, 1997 (JP) ............................................... 9-340919

(51) Int. Cl.⁷ .................................................... H05K 1/14
(52) U.S. Cl. ..................... 361/777; 361/772; 361/760; 361/818; 361/820; 174/250; 174/255; 174/260; 174/262; 174/266; 257/698; 257/734; 257/737; 257/738

(58) Field of Search .............................. 361/777, 772, 361/778, 760, 766, 816, 818, 820; 174/52.1, 250, 255, 260, 262, 266; 333/4, 5, 12, 260; 257/698, 734, 737, 738, 774, 783, 782, 784

(56) References Cited

U.S. PATENT DOCUMENTS

| | | | | |
|---|---|---|---|---|
| 4,975,761 A | * | 12/1990 | Chu ............................. | 257/686 |
| 5,436,203 A | * | 7/1995 | Lin ............................... | 29/814 |
| 5,488,540 A | * | 1/1996 | Hatta ........................... | 361/794 |
| 5,639,989 A | * | 6/1997 | Higgins, III .................. | 174/35 |
| 5,838,549 A | * | 11/1998 | Nagata et al. ................ | 361/794 |
| 5,838,551 A | * | 11/1998 | Chan ............................ | 361/818 |
| 5,847,451 A | | 12/1998 | Ohtaki et al. ................ | 257/697 |
| 6,058,022 A | * | 5/2000 | Gianni et al. ................ | 361/794 |
| 6,081,026 A | * | 6/2000 | Wang et al. .................. | 257/700 |

* cited by examiner

*Primary Examiner*—Lynn D. Feild
(74) *Attorney, Agent, or Firm*—Fitzpatrick, Cella, Harper & Scinto

(57) ABSTRACT

In a semiconductor package which contains an IC element therein and effects the inputting and outputting of a signal to the IC element through a plurality of pads, a group of signals is layout-patterned so as to be divided into a plurality of groups such as a group of signals weak against noise, a group of signals liable to discharge noise and a group of signals exchanging a heavy current and so that the groups may be isolated from one another.

14 Claims, 9 Drawing Sheets

SEMICONDUCTOR PACKAGE

BACKGROUND OF THE INVENTION

1. Field of the Invention

This invention relates to a semiconductor package particularly such as a ball grid array package to which a countermeasure for cross talk noise between signal lines is applied.

2. Related Background Art

In recent years, in the tendency of IC toward more pins and smaller size, a narrower pitch in a surface mounting package such as a shrink small out package (hereinafter abbreviated as SSOP) or a quad flat package (hereinafter abbreviated as QFP) has been advanced more and more.

Particularly, as a narrower pitch, for example, QFP of 0.5 mm is often used in handy instruments.

However, when packaging cost is taken into account, further narrowing of the pitch has become limited from various viewpoints such as a packaging apparatus, a packaging material and packaging control, and as an answer to the desire for more pins, there is adopted a method of solving without making the body size of the package larger, i.e., a pin grid array (hereinafter abbreviated as PGA) as a two-dimensional pin arrangement instead of a conventional one-dimensional pin arrangement or a ball grid array (hereinafter abbreviated as BGA). Particularly PGA, as a simple answer to the tendency toward more pins rather than its size, has utilized sockets since long ago and has often been used in the CPU, gate arrays and the like of personal computers.

Generally, PGA often handles many pins and high-speed digital signals and the package thereof is often expensive. On the other hand, BGA, unlike PGA, is a package for surface mounting at first and moreover, has a chip placed on a printed substrate or the like including a flexible printed substrate and has solder balls disposed at a relatively rough pitch in the form of a grid on the back thereof. Accordingly, in spite of the rough pitch, many pins can be secured for a package size, and relatively low-cost packaging is possible by the self position modifying effect or the so-called self alignment effect by the solder balls.

However, BGA is a planar (two-dimensional) pad arrangement and therefore, it is the premise thereof to receive it by a mother board which is a multi-layer substrate, but since highly dense pads are disposed on a narrow area, the cross talk between signals increases, and also when wiring is drawn out in the mother board, so-called cross talk which is the electrical leakage of signals is increased by the capacity coupling by the grade separation between drawn-out lines.

Also, as described above, QFP is known as the typical semiconductor package, but in recent years, with the higher density of semiconductor elements, the number of electrodes (for example, power source pins and signal pins) has also increased rapidly, and the tendency of semiconductor elements toward more pins has advanced.

On the other hand, compactness and thinness have been required of the types of machines using semiconductor elements, and the downsizing of semiconductor packages has been required to package semiconductor elements more highly density.

As the result, OMPAC (over-molded plastic array carrier) has been proposed as a new semiconductor package.

FIG. 13 of the accompanying drawings shows OMPAC. As the typical construction of OMPAC, a semiconductor element 101 is carried on a printed substrate 102, and the wiring pattern of the printed substrate 102 and the electrode portion of the semiconductor element 101 are connected together by wire bonding 103. Also, this wiring pattern is connected to the pertinent electrode land 106 of a plurality of electrode lands formed in a matrix-like form on the back side of the printed substrate 102, and further this electrode land melts a solder ball and forms the protruded electrode portion 105 of the solder ball.

Also, the upper surface portion of the semiconductor element 101 is molded by a transfer mold 104, whereby the semiconductor element 101 is hermetically sealed.

The thus constructed OMPAC permits electrodes to be formed in a matrix-like shape on the back of the substrate and therefore, providing more pins is possible even when the space between adjacent electrodes is as wide a pitch as 1.0 to 1.5 mm.

Accordingly, when this semiconductor package is to be packaged, it is not necessary to print cream solder with a minute pattern, and solder balls excellent in strength become the electrodes of the semiconductor package and therefore, this semiconductor package can be made into a semiconductor package easy to handle and having many pins. Such a semiconductor package of many pins is called BGA (ball grid array) and has become widely adopted.

As a substrate for carrying the BGA package thereon, use has in recent years been made of not only a printed substrate but also a ceramic substrate, a tape substrate or the like.

The packaging of such a BGA package is easily solder-connected to a parent substrate called a mother board, and electronic parts electrically connected to the BGA package are also mounted and disposed on the mother board proximate to this BGA package.

FIG. 14 of the accompanying drawings is a diagram showing an example of the connection between an IC chip enclosed in the BGA and additional elements around it. The reference numeral 110 designates an. MPU (microprocessing unit) which is an IC chip, the reference numeral 111 denotes a bypass capacitor connected between a power source terminal (VCC) and a GND terminal (VSS) for preventing the malfunctioning of the IC chip by the fluctuation of a power source, and the reference numerals 112 and 113 designate capacitors for a charge pump constituting a charge pump circuit, and connected between charge pump terminals CP1 and CP2 and the GND terminal (VSS) as shown, and making a voltage twice or thrice as great as a certain reference voltage which is used chiefly as a liquid crystal driving voltage.

The reference numeral 114 denotes an XTAL (crystal) oscillator for the low speed operation of the IC chip and liquid crystal drive timing, and the opposite ends of the element are connected to oscillation terminals (XTAL1 and XTAL2).

The reference numeral 115 designates a high speed oscillator, and an element of three terminals containing an oscillation capacitor therein is often used for the high speed operation of the IC chip, and this high speed oscillator is connected between oscillation terminals (XTAL3 and XTAL4) and the GND terminal (VSS).

The above-described elements 112 to 115 all constitute a high impedance circuit, and are liable to be affected by the noise from outside and the cross talk noise of proximate lines, thus causing the malfunctioning of the IC chip or the problem that the IC chip does not operate at all. Therefore, it is necessary that the IC chip 110, the bypass capacitor 111 and the elements 112 to 115 added to the high impedance circuit be disposed at locations as proximate as possible to one-another, and the connection thereof must be done with the cross talk noise sufficiently taken into account.

FIG. 15 of the accompanying drawings shows a prior-art BGA package and the surrounding elements described above with reference to FIG. 14 as they are mounted, and a BGA package 120 formed with an IC chip 110 enclosed therein is solder-connected to and mounted on a parent substrate 122 called a mother board through the solder ball portion shown in FIG. 13.

The connection to the surrounding elements is effected by the patterning in the multi-layered mother board 122, and must be done with the problem of cross talk noise or the like fully taken into account.

Also, the aforedescribed multi-layering of the mother board 122 is limited in using the element mounting surface in the connection with the other elements than the above-mentioned surrounding elements from the BGA package terminals of many pins, according to a construction in which as in the aforedescribed example of the prior art, elements are disposed around the BGA package 120, and such a limitation is caused because a digital signal and an analog signal including the aforementioned high impedance portion must be separated from each other as a countermeasure for cross talk, but of course, if the mother board is multi-layered, the cost of the substrate will rise and it will become difficult to adopt BGA in a low-cost product.

Also, to increase the number of layers of the substrate in order to simply take a countermeasure for cross talk noise, or to carry out the countermeasure for cross talk noise by a small number of layers, patterning must be done with a sufficient time spent for consideration, and at any rate, a problem will be left.

Further, there is a method of mounting an intermediate substrate for BGA packaging between BGA and the mother board, and an example thereof is shown in FIG. 16 of the accompanying drawings.

In FIG. 16, the reference numeral 120 designates a BGA package, and this figure shows a mounting method of interposing upper surface electrodes 126, lower surface electrodes 128, through-holes 127 connecting the upper surface electrodes 126 and the lower surface electrodes 128 together, and an intermediate substrate 123 comprised of projected electrodes comprising solder balls 125 and 129 connecting the upper and lower surface electrodes to the outside between a BGA package of the universal type comprised of a wiring substrate 121, electrode lands 124, solder balls 125, etc. and a mother board 122 having electrode lands 130 on the upper surface thereof.

The purpose of using such intermediate substrate is to prevent the warping of the substrate attributable to the mismatching of the coefficients of thermal expansion of the wiring substrate 121 of the BGA package 120 and the mother board 122 from being created by heat being applied when the BGA package 120 is reflow-mounted on the mother board 122, and the joint strength by the solder balls from being reduced, and as the material of this intermediate substrate, use is made of a material having the approximately medium coefficient of thermal expansion of the coefficients of thermal expansion of the wiring substrate 121 of the BGA package 120 and the mother board 122.

As regards the joint of the substrates, the projected electrodes of the BGA package and the upper surface electrodes 126 of the intermediate substrate 127 are joined together, and the projected electrodes comprising the solder balls 129 added to the lower surface electrodes 128 of the intermediate substrate 127 and the electrodes 130 or lands on the mother board 122 are joined together.

Again in such a mounting system, when the surrounding elements as shown in FIG. 14 are required, the multi-layering of the mother board becomes necessary in order to prevent the influence of the cross talk noise from a digital line on a signal of high impedance, and this leads to an increase in cost and a reduction in the degree of freedom of wiring patterning.

SUMMARY OF THE INVENTION

It is an object of the present invention to solve the above-noted disadvantage and to provide a semiconductor package to which a countermeasure for the cross talk noise between the signal lines of a ball grid array is applied.

It is another object of the present invention to divide the signal lines of a ball grid array into a plurality of groups to thereby cast off and pattern them so as to isolate them from one another.

It is still another object of the present invention to provide a land pattern capable of carrying thereon electronic parts discrete from an IC chip in the outer peripheral portion of a wiring substrate except an IC chip enclosing portion.

It is yet still another object of the present invention to provide a land pattern capable of carrying electronic parts thereon on the outer peripheral portion of an intermediate substrate mounted between a semiconductor package and asprinted wiring substrate having the semiconductor package mounted thereon, except the semiconductor package mounting portion.

Other objects of the present invention will become apparent from the following description of some specific embodiments of the invention.

DESCRIPTION OF THE PREFERRED EMBODIMENTS

Some embodiments of the present invention will hereinafter be described with reference to the drawings, and a first embodiment of the present invention will first be described with reference to FIGS. 1 to 8.

Figure 1:
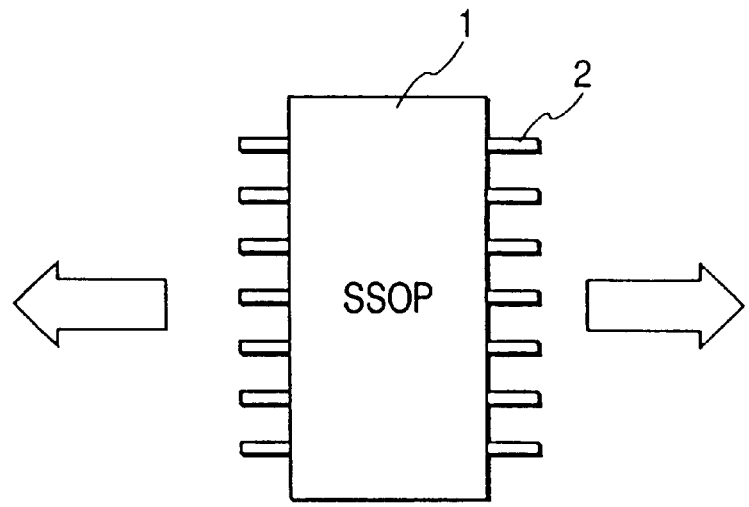
FIG. 1 is a plan view showing the drawn-out state of the wiring of SSOP.
Figure 2:
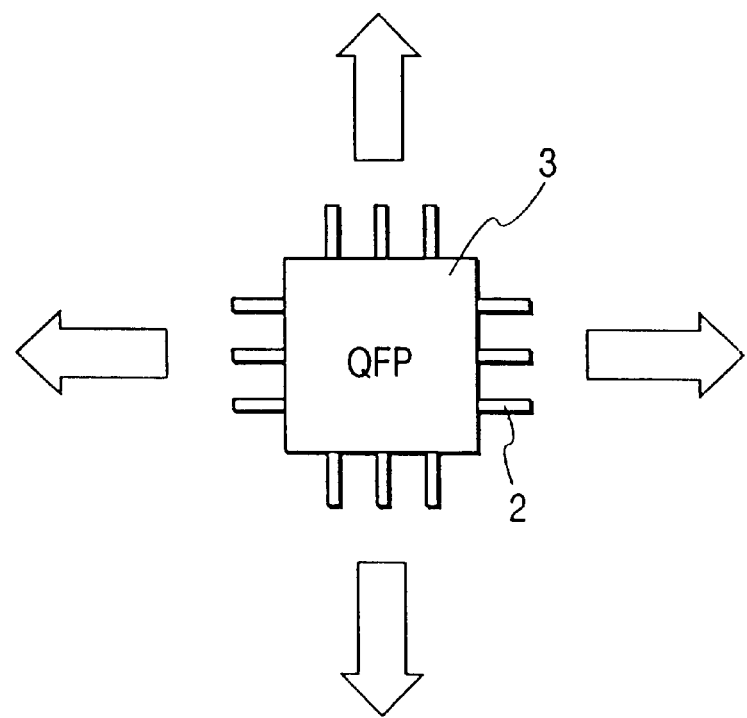
FIG. 2 is a plan view showing the drawn-out state of the wiring of QFP.

FIG. 1 is a plan view of a popular SSOP as a surface mounting package, and FIG. 2 is a plan view of a popular QFP as a surface mounting package.

Figure 3:
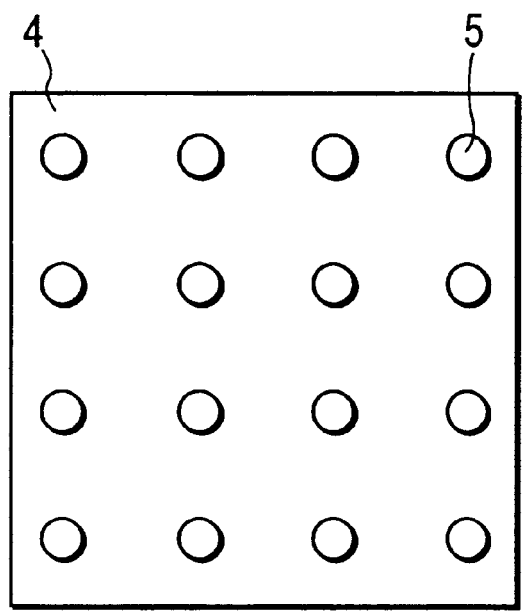
FIG. 3 is a bottom plan view of a BGA according to the present invention.
Figure 4:
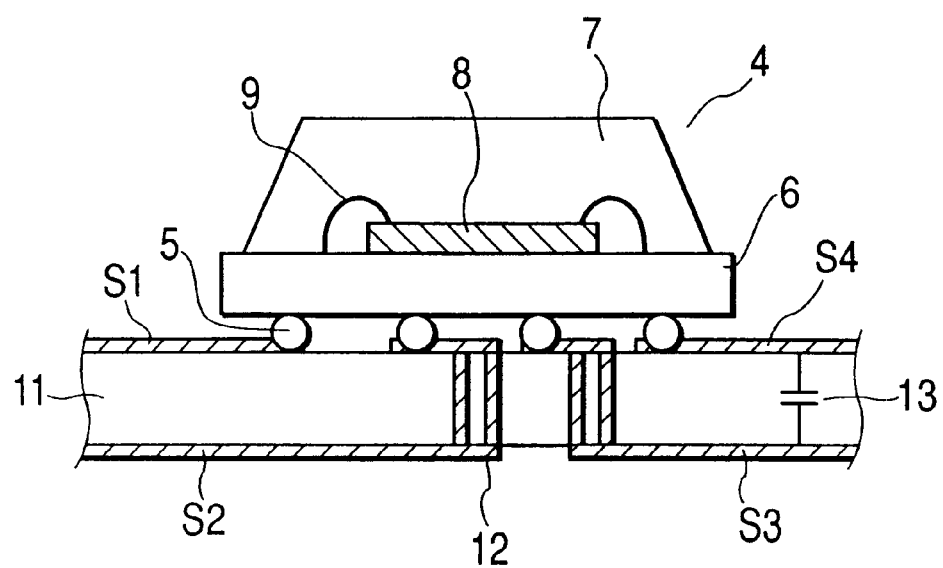
FIG. 4 is a cross-sectional view when the BGA according to a first embodiment shown in FIG. 3 is mounted.

The SSOP has a plurality of leads 2 protruding from the opposite ends of a body 1. In this SSOP, the leads 2 are arranged as shown in FIG. 1 and therefore, the draw-out of the wiring thereof is effected in two directions as indicated by arrows. On the other hand, in the QFP, a plurality of leads 2 protrude from the four sides of a body 3, and the draw-out lines of the wiring thereof are four directions as indicated by arrows in FIG. 2. Accordingly, the SSOP and QFP only pliably widen outwardly if signals are simply to be drawn out of them, and there is not the necessity of causing the signals to intersect with each other. In reality, the intersection between the signals occurs due to the limitation of other IC, circuit, etc. attached to the outside, but as the essence of these packages, smooth draw-out of the wiring is possible. On the other hand, in a BGA, as shown in FIG. 3, solder balls 5 are arranged in a grid-like shape on the bottom surface of a BGA package 4. FIG. 4 shows the mounted state of the BGA package shown in FIG. 3, and an IC chip 8 connected onto a BGA substrate 6 by bonding wires 9 is enclosed in mold resin 7. On the back, or bottom surface, of the BGA substrate 6, solder balls 5 are disposed in a grid-like shape or in the shape of a square. As the BGA substrate 6, there is a hard one such as FR-4 or BT resin, but a flexible printed substrate or the like is sometimes used. Also, the IC chip 8 may be reversely connected by a bump called a flip chip, besides by the bonding wires 9.

Further, there is a package of narrow pitch called CSP (chip size package). Generally, BGA in which the ball pitch is 0.8 mm or less is often called CSP.

The feature of these packages is that unlike the surface mounted package such as QFP in which pins are provided on four sides, pins are provided entirely two-dimensionally on the back of the package and therefore pins can be attached very highly densely. In that sense, a device such as LGA (land grid array) which does not use solder balls for the connection of pins is recently being developed, and in the sense of pin attachment effectively using the whole of the back of the package of this type, these packages match the gist of the present invention and can be applied to the present invention.

The reference numeral 11 designates a mother board, and after respective solder balls 5 are mounted on this mother board 11, the draw-out of signal lines such as S1, S2, S3 and S4 is effected. S1 and S4 are the draw-out of a multi-layer substrate on the surface side on which BGA is mounted, and S2 and S3 effect the draw-out of the back through a through-hole 12. At this time, there is capacity coupling 13 between signal lines S3 and S4.

Figure 5:
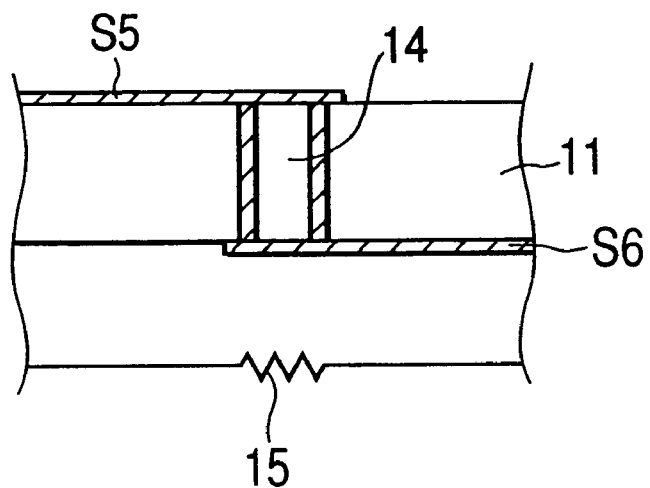
FIG. 5 is an illustration of the through-hole portion of FIG. 4.
Figure 6:
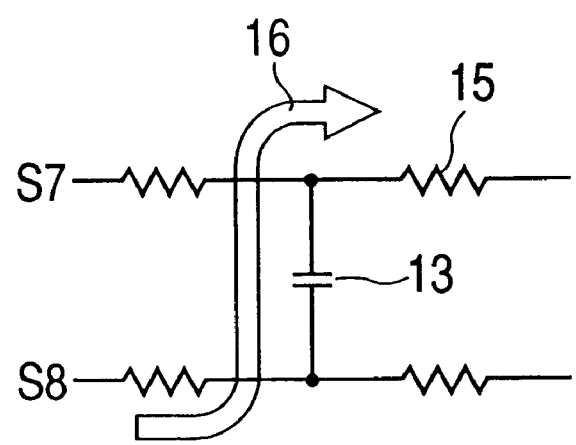
FIG. 6 shows a transmission line for a certain signal on the board of FIG. 4.

Also, as shown in FIG. 5, an amount of resistance 15 is created between the signal line S5 and signal line S6 of the mother board 11 in which there is a through-hole 14. Therefore, as shown in FIG. 6, cross talk 16 becomes liable to be created between the signal line S7 and signal line S8 of the mother board 11 by the amount of resistance 15 and the capacity coupling 13.

In the wiring draw-out in SSOP or QFP, the capacity coupling by the draw-out of adjacent pins is only of an amount by which the thickness of copper foil has opposed, but in the wiring draw-out of BGA, there is capacity coupling in a wide area wherein a draw-out line width has opposed and therefore, cross talk is liable to become great.

Figure 7:
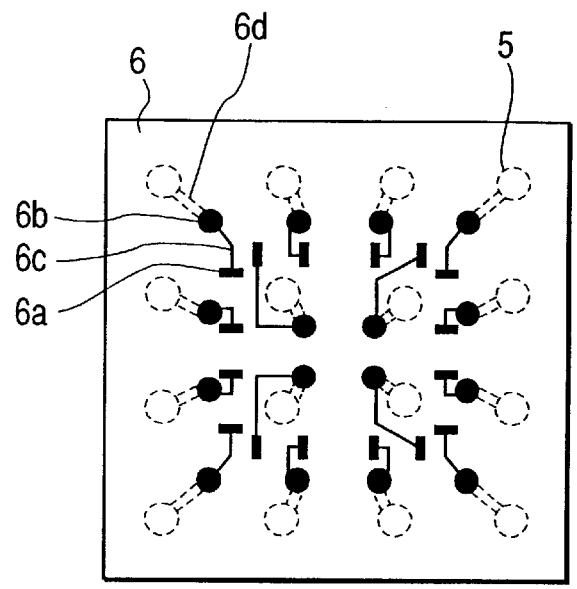
FIG. 7 is a top plan view of a BGA board shown in FIG. 4.

FIG. 7 is a top plan view of the BGA substrate 6 shown in FIG. 4, and on the BGA substrate 6, four power source lands 6a each extending vertically and horizontally on the substrate, thus sixteen power source lands 6a in total are disposed so as to form a square from the central portion, and sixteen through-holes 6b are disposed in a grid-like shape so as to surround these power source lands 6a from the outside and the inside. Also, sixteen solder balls 5 are disposed in a grid-like shape on the bottom surface of the BGA substrate 6. Each power source land 6a and each through-hole 6b are connected together by a wiring pattern 6c so that as a countermeasure for cross talk, the signal line may be divided into a plurality of groups which may be isolated from: one another and cast off and patterned, and each through-hole 6b and each solder ball 5 are connected together by a wiring pattern 6d.

Figure 8:
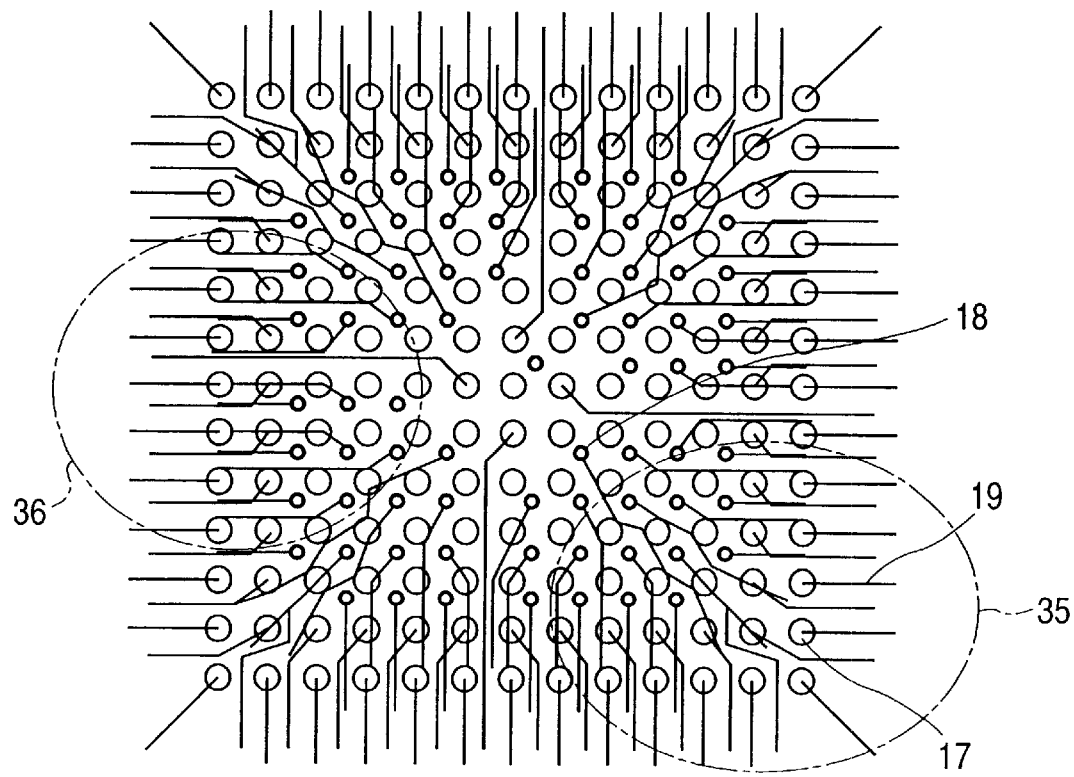
FIG. 8 shows a modification of the first embodiment and the drawn-out state of the mounting surface of a mother board in which the number of pins of the BGA shown in FIG. 4 is changed.

FIG. 8 shows a modification of the BGA package 4 shown in FIG. 4, and while the number of pins of the BGA shown in FIG. 4 is 4×4, thus 16 in total, in FIG. 8, it is changed to 16×16 pins, thus 169 pins in total and the wiring draw-out of the BGA is carried out on a mother board which is a two-surface substrate, and the drawn-out state of the mounting surface of the mother board 11 is shown through both layers, and the reference numeral 17 designates solder pads, the reference numeral 18 denote through-holes, and the reference numeral 19 designates draw-out lines.

Figure 9A:
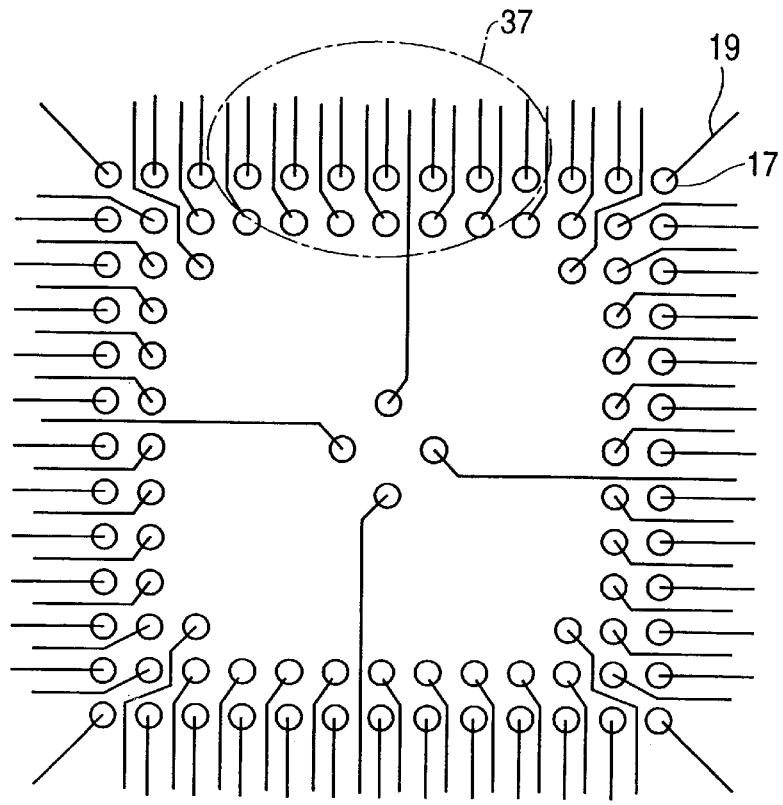
FIG. 9A shows the drawn-out state of the mounting surface of the mother board shown in FIG. 8.
Figure 9B:
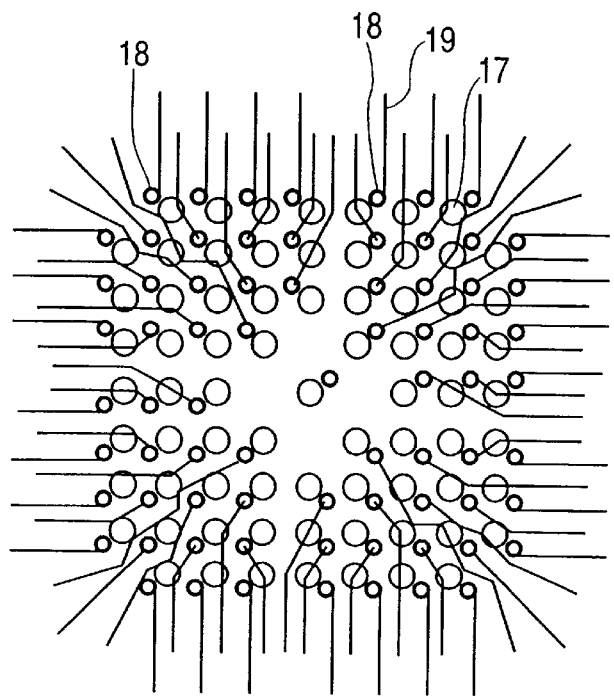
FIG. 9B shows the drawn-out state of the back through the through-hole of the mother board shown in FIG. 8.

FIG. 9A shows the drawn-out state of the mounting surface of the mother board 11 shown in FIG. 8, and FIG. 9B shows the drawn-out state of the back through the through-holes of the mother board 11 shown in FIG. 8.

In FIG. 9A, the solder pads 17 and through-holes 18 are present in the body, but the through-holes 18 are intentionally omitted to eliminate the difficulty of seeing.

The through-holes 18 shown in FIG. 9B shift the signals from the solder pads 17 immediately adjacent thereto to the back and draw out them..

As shown in FIGS. 8 to 9B, the overlapping of the signals between the surfaces and backs of considerable parts is seen even if they are simply drawn out and seen through. That is, it is considered that cross talk is likely to occur considerably.

At present, most of the IC chips carried on BGA are digital ICs such as memories, microprocessors, digital signal processing ICs and gate arrays. In the future, it is considered that mixed digital-analog ICs or the like will become carried on BGA with more pins and low mounting cost as a weapon, but much care need be taken of the cross talk as previously described.

Figure 10:
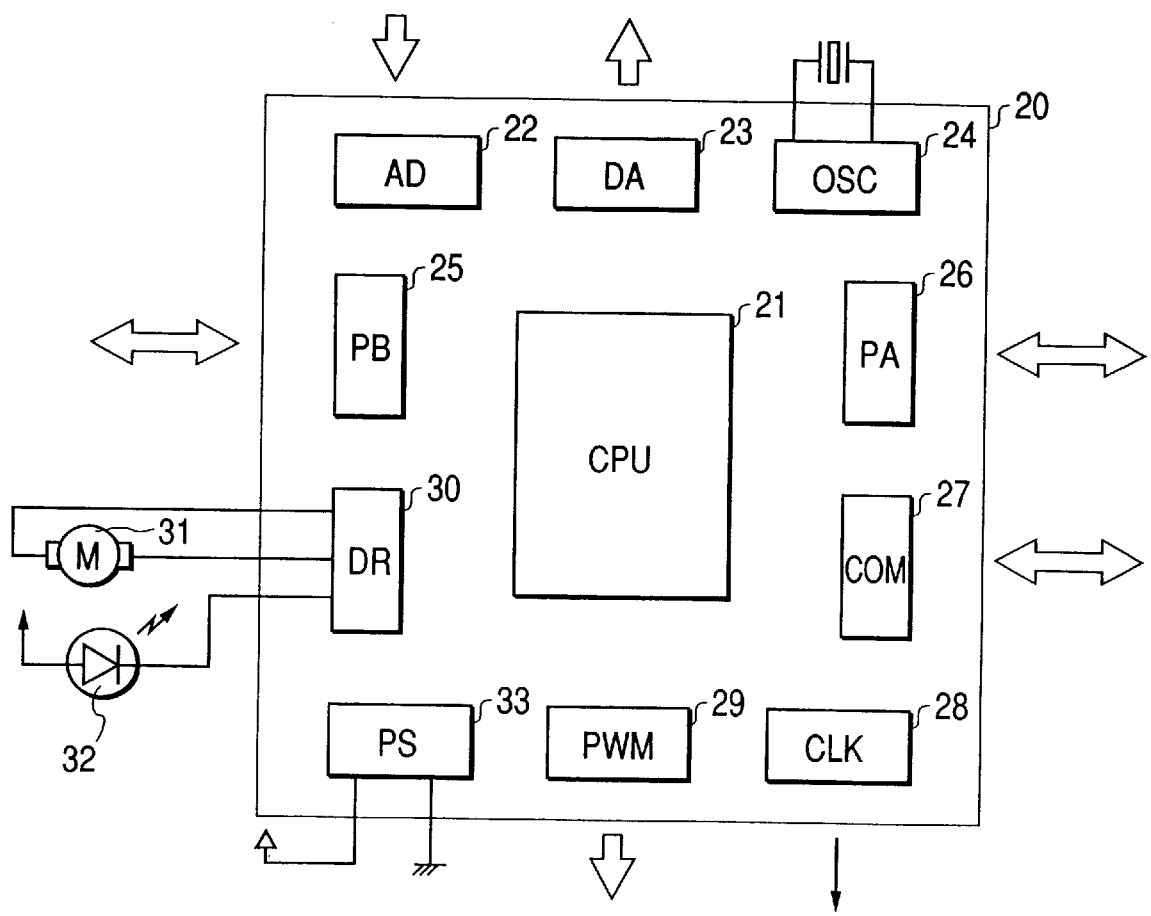
FIG. 10 is a plan view showing an IC chip used in the BGA according to the modification of the first embodiment of FIG. 8.

FIG. 10 shows a single-chip micro-computer 20 as a mixed digital-analog IC used in the BGA of FIG. 8.

The reference numeral 21 designates a CPU, the reference numeral 22 denotes an AD converter, the reference numeral 23 designates a DA converter, the reference numeral 24 denotes an oscillation circuit OSC, the reference numeral 25 designates a universal port PB, the reference numeral 26 denotes a universal port PA, the reference numeral 27 designates a communication port COM, the reference numeral 28 denotes a clock terminal CLK, the reference numeral 29 designates a PWM, and the reference numeral 30 denotes a driver DR which takes in and out a relatively heavy current like a motor 31 and a light emitting indicator 32. The reference numeral 33 designates a power source PS.

The AD converter 22, the DA converter 23, the oscillation circuit OSC, etc. are analog blocks, and high accuracy is required of them, and they are high in impedance and very weak against the noise from the outside.

On the other hand, the communication port COM 27, the clock terminal CLK 28 of a high speed clock and the PWM 29 are a group of signals relatively high in frequency among digital signals and therefore liable to discharge noise.

Also, the driver DR 30 and the power source PS 33 are terminals exchanging a relatively heavy current and can therefore be said to be terminals in which when wiring resistance is included in the current paths thereof, a potential difference is caused and which are liable to discharge noise. Also, as a group of signals exchanging a relatively heavy current, there are a ground an actuator driving portion, a light emitting element driving portion, etc., besides those mentioned above.

Accordingly, the group of analog blocks such as the AD converter 22, the DA converter 23 and the oscillation circuit OSC 24 need be isolated from the other portions and be decreased in the cross talk by capacity coupling, and by these being disposed in the corner portion 35 and outer peripheral portions 36 and 37 of the BGA, the inconvenience by noise can be prevented. Also, conversely to the group of analog blocks, the groups of digital signals such as the communication port COM 27, the clock terminal CLK 28 and the PWM 29 are disposed in another corner portion and another outer peripheral portion of the BGA and isolated from one another, whereby the inconvenience by noise can be prevented. Further, the driver DR 30 and the power source PS 33 create a potential difference and become a source of noise when there is a high resistance portion such as a through-hole and therefore, by disposing them in a pad which does not pass through the through-hole or disposing them in another corner portion and another outer peripheral portion of the BGA to isolate them from other signals, the inconvenience by noise can be avoided.

The inconvenience can also be coped with by casting off the groups of block signals on pads which can be directly drawn out of the mounted surface of the BGA package.

It can not only be realized by the pad layout of the IC in the BGA, but also be realized by arbitrarily contriving a method of drawing around in the BGA substrate generally comprised of a multi layer substrate.

According to an embodiment of the present invention, even if a BGA which fits more pins and is relatively low in mounting cost is adopted in a mixed digital-analog IC, a plan can be elaborated in the pin arrangement thereof to thereby eliminate the demerit resulting from a great deal of capacity coupling the BGA originally has, and prevent the creation of noise by crosstalk.

Also, the replacement of the wiring in the BGA substrate can be done relatively easily and therefore, this technique becomes more realistic.

Also, according to the present invention, layout disposition patterning can be easily realized by the pad layout of the IC in the BGA, and the groups of signals weak against noise can be obviated from becoming inconvenient.

Figure 11:
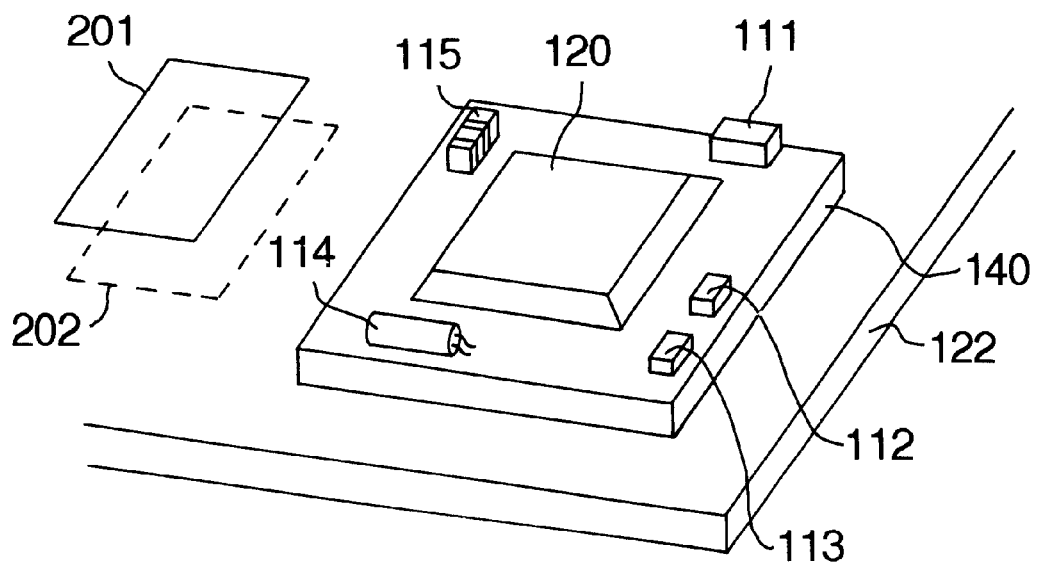
FIG. 11 shows the mounting of a semiconductor package according to a second embodiment of the present invention.

FIG. 11 shows a second embodiment of the present invention.

Figure 14:
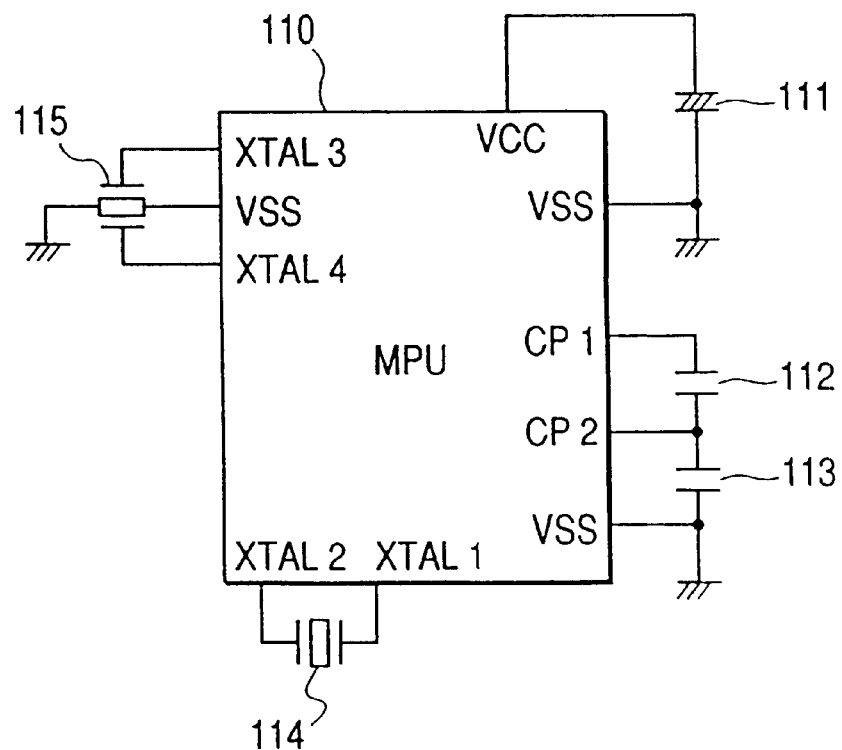
FIG. 14 is a diagram of an IC chip and surrounding additional elements.
Figure 15:
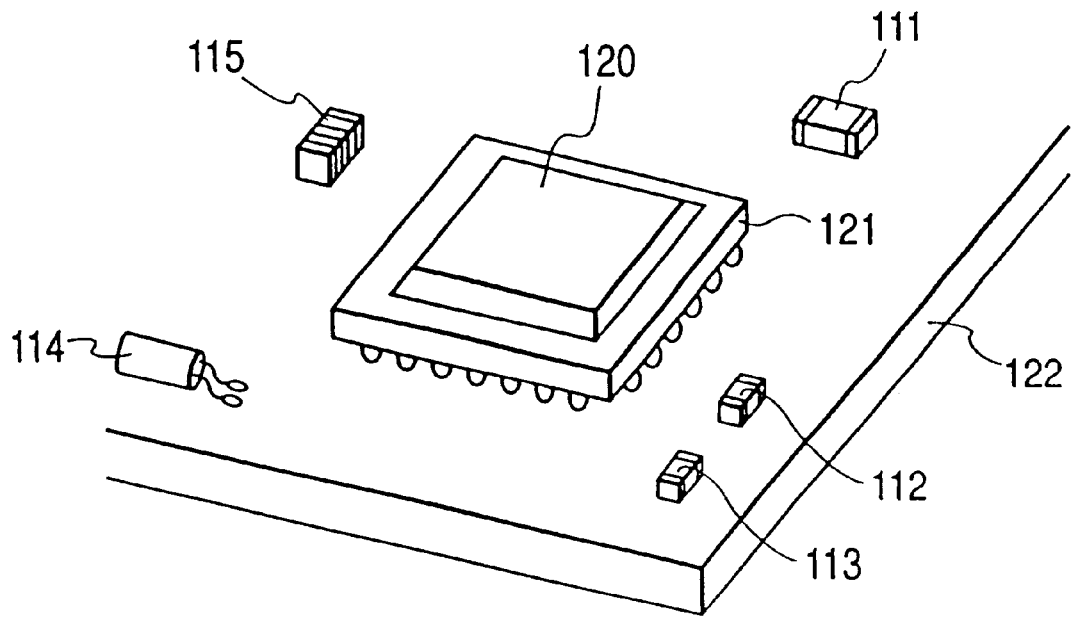
FIG. 15 shows the IC chip and surrounding additional elements of FIG. 14 as they are mounted as a BGA package and surrounding additional elements.
Figure 16:
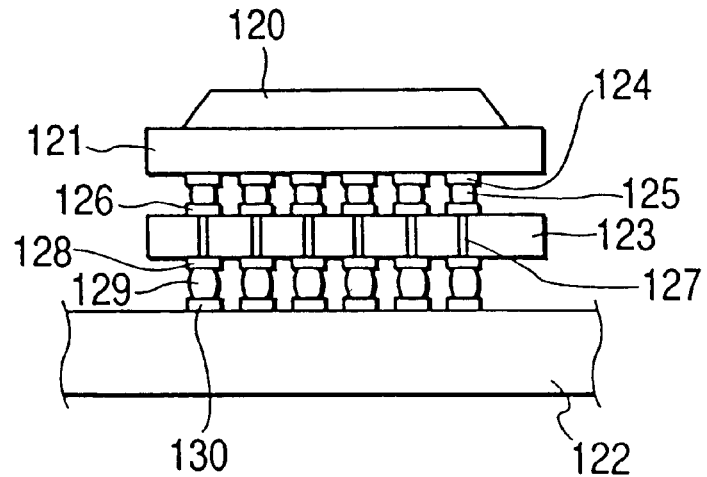
FIG. 16 shows the mounting of a prior-art BGA package provided with an intermediate substrate.

The reference numeral 120 designates a BGA package enclosing an IC chip therein, and a portion to which an IC chip 110 has been transfer-molded and a portion in which the surrounding elements described in connection with FIG. 14 are mounted become integral with each other on a wiring substrate 140 for the BGA package, and constitute a BGA package.

Although not shown, as in the prior art, projected electrodes are also formed on the wiring substrate 140 by solder balls disposed in a matrix-like form on the back thereof, and are solder-connected and mounted on a mother board 122.

The wiring substrate 140 has therein a land pattern, not shown, adapted to be capable of carrying the surrounding elements thereon, and a digital signal and an analog signal are processed up to the projected electrodes so as not to be affected by cross talk noise, and this construction can accomplish the patterning in the mother board 122 more simply. For example, such separation as an analog signal pattern 201 on the surface of the mother board 122 and a digital signal pattern 202 on the back of the mother board 122 is also possible and it is also possible to reduce the number of layers of the substrate, and the adoption of a low-cost mother board is possible.

Also, design is made such that the surrounding elements can also be carried on the wiring substrate 140 and therefore, the wiring between the IC chip 110 and the surrounding elements can be processed on this wiring substrate and thus, it also becomes possible to reduce the number of the projected electrodes.

Figure 12:
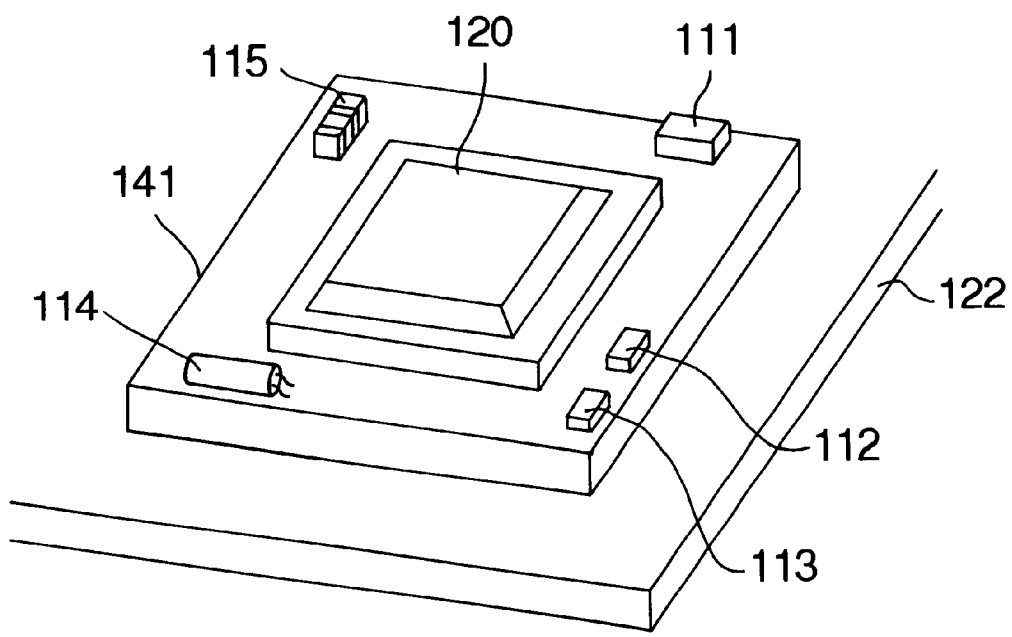
FIG. 12 shows the mounting of a semiconductor package according to a third embodiment of the present invention.

FIG. 12 shows a third embodiment of the present invention.

Figure 13:
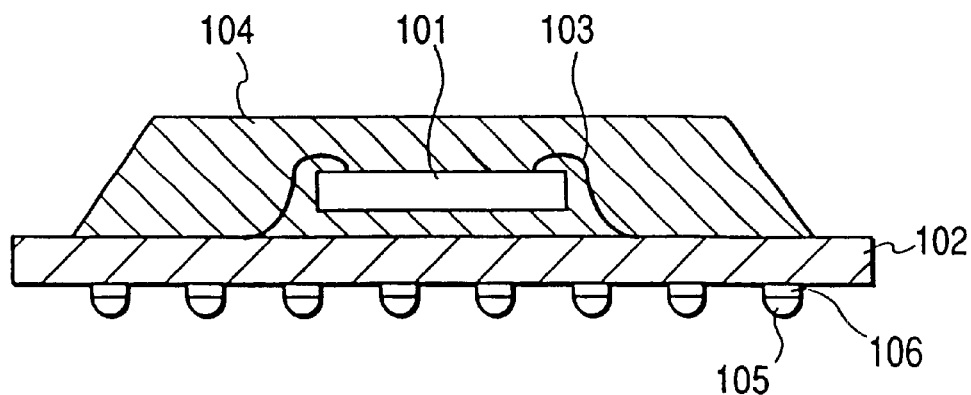
FIG. 13 shows OMPAC as the BGA package according to the prior art.

The reference numeral 120 designates a BGA package of the universal type as described in connection also with FIG. 13, the reference numeral 141 denotes an intermediate substrate for BGA mounting, and the reference numeral 122 designates a mother board. The intermediate substrate has upper surface electrodes and lower surface electrodes for effecting the connection to a BGA package, not shown, and the mother board, and also has a land pattern, not shown, adapted to be capable of carrying thereon also the surrounding elements described in connection with FIG. 14 and therefore, the surrounding elements can be disposed very proximately to an IC chip, and the malfunctioning of the IC chip by cross talk noise, the fluctuation of the power source, etc. can be prevented. Further, there are obtained effects similar to those of the first embodiment, such as a reduction in the number of substrate layers of the mother board and the possibility of adopting a low-cost mother board.

As described above, according to the second and third embodiments of the present invention, surrounding electronic parts discrete from the IC chip can be carried on the intermediate substrate for mounting the BGA package thereon interposed between the wiring substrate of the BGA package or the BGA package of the universal type and the mother board and therefore, even in the case of a high-speed operation like that of a microcomputer and a semiconductor package carrying a multi-function IC chip thereon, it becomes possible to dispose a signal terminal of high impedance and additional electronic parts connected from a power source terminal as proximately as possible to the IC chip, and even when a mother board comprising a low-cost both-surface substrate is used, it becomes easy to suppress the cross talk noise from other signal lines and the occurrence of the malfunctioning of the IC chip by the fluctuation of the power source. Also, an increase in the cost of the mother board can also be suppressed, and the adoption of the BGA package in low-price commodities also becomes possible.

What is claimed is:

1. A circuit substrate on which a semiconductor package is mounted, comprising:
   a semiconductor package having a circuit substrate, wherein a circuit element liable to discharge noise and a circuit element liable to be effected by the noise from outside are provided on a front side of said circuit substrate, and a plurality of electrodes electrically connected to said circuit elements through a through-hole are provided on a reverse side of said circuit substrate;
   a mother board electrically connected to said semiconductor package; and
   a solder pad portion electrically connected to said electrodes through a solder and draw-out lines extending from said solder pad portion provided on a front side of said mother board, wherein said draw-out lines connected to said circuit element liable to discharge noise are grouped and isolated from said draw-out lines connected to said circuit element liable to be effected by the noise from outside.

2. A circuit substrate according to claim 1, wherein said draw-out lines are wired at corner portions of said semiconductor package, and said draw-out lines connected to said circuit element liable to discharge noise are wired at corners portions or at an outer periphery of said semiconductor package different from said draw-out lines connected to said circuit element liable to be effected by the noise from outside.

3. A circuit substrate according to claim 2, wherein a draw-out line electrically connected to said draw-out lines through a through-hole is provided on a reverse side of said circuit substrate, and said draw-out lines connected to said circuit element liable to discharge noise are provided on the front side of said circuit substrate.

4. A semiconductor package comprising:
   a substrate;
   circuit elements liable to discharge noise and circuit elements liable to be effected by the noise from outside provided on a front side of said substrate; and
   a plurality of electrodes electrically connected to said circuit elements through a through-hole provided on a reverse side of said substrate, wherein said circuit elements liable to discharge noise are grouped and isolated from said circuit elements liable to be effected by the noise from outside.

5. A semiconductor package according to claim 4, wherein said circuit elements liable to discharge noise are provided at corner portions or at an outer periphery of said substrate different from said circuit elements liable to be effected by the noise from outside.

6. A semiconductor package according to claim 4, wherein said circuit elements liable to discharge noise are analog blocks, and said circuit element liable to be effected by the noise from outside is a digital block having a high frequency or an element for handling electrical current.

7. A semiconductor package according to claim 6, wherein said analog blocks include at least one of an AD converter, a DA converter and an oscillation circuit, said digital block includes at least one of a communication port, a clock terminal and a PWM, and said element for handling electrical current includes at least one of a driver, a power source, a ground, an actuator driving portion and a light emitting element driving portion.

8. A semiconductor package comprising:
   a grid array substrate; and
   an IC chip element and a surrounding element provided adjacent to said IC chip element mounted on a front side of a said grid array substrate, with said surrounding element being an element loaded to a high impedance circuit, wherein electrodes arranged in a matrix or hollow square and electrically connected to said IC chip are provided on a reverse side of said grid array substrate.

9. A circuit substrate on which a semiconductor package according to claim 8 is mounted.

10. A semiconductor package according to claim 8, wherein said surrounding element further comprises a by-pass capacitor.

11. A circuit substrate on which a semiconductor package is mounted, comprising:
    a semiconductor package having:
       a grid array substrate,
       an IC chip element mounted on a front side of said grid array substrate, and electrodes arranged in matrix or hollow square and electrically connected to said IC chip provided on a reverse side of said grid array substrate;
    an intermediate substrate, with
    an upper electrode electrically connected to each said electrode through a solder ball and a surrounding element wired close to said upper electrode mounted on a surface of said intermediate substrate, and a lower electrode connected to said upper electrode through a through-hole provided on a reverse side of said intermediate substrate; and
    a mother board electrically connected to said lower electrode of said intermediate substrate through a solder.

12. A circuit substrate on which a semiconductor package is mounted, comprising:
    a semiconductor package having a circuit substrate, wherein a circuit element apt to release noise and a circuit element fragile to external noise are provided on a front side of said circuit substrate, and plurality of electrodes electrically connected to said circuit elements are provided on a reverse side of said circuit substrate;
    a mother board electrically connected to said semiconductor package; and
    a solder pad portion electrically connected to said electrodes through a solder and draw-out lines extending from said solder pad portion provided on a front side of said mother board, said draw-out lines being connected to said circuit elements.

13. A circuit substrate according to claim 12, wherein said draw-out lines are wired at corner portions of said semiconductor package, and said draw-out lines connected to said circuit element apt to release noise are wired at corners portions different from said draw-out lines connected to said circuit element fragile to external noise or at an outer periphery of said semiconductor package.

14. A circuit substrate according to claim 13, wherein a draw-out line electrically connected to said draw-out lines through a through-hole is provided on a reverse side of said circuit substrate, and said draw-out lines connected to said circuit element apt to release noise are provided on the front side of said circuit substrate.

* * * * *

UNITED STATES PATENT AND TRADEMARK OFFICE
CERTIFICATE OF CORRECTION

PATENT NO. : 6,512,680 B2
DATED : January 28, 2003
INVENTOR(S) : Yoshihito Harada et al.

It is certified that error appears in the above-identified patent and that said Letters Patent is hereby corrected as shown below:

Column 2,
Line 37, "an." should read -- an --.

Column 3,
Line 11, "effected" should read -- affected --.

Column 4,
Line 29, "asprinted" should read -- a printed --.

Column 5,
Line 64, "draw-out:" should read -- draw-out --.

Column 6,
Line 28, "from:" should read -- from --.

Column 7,
Line 25, "ground" should read -- ground, --.
Line 55, "multi layer" should read -- multi-layer --.

Column 9,
Lines 11, 24, 32, 42, 48, 54 and 57, "effected" should read -- affected --.
Line 29, "corners" should read -- corner --.

Column 10,
Line 42, "plurality" should read -- a plurality --.
Line 56, "corners" should read -- corner --.

Signed and Sealed this

Seventh Day of October, 2003

JAMES E. ROGAN
*Director of the United States Patent and Trademark Office*